United States Patent [19]
Aleksic et al.

[11] Patent Number: 5,995,736
[45] Date of Patent: Nov. 30, 1999

[54] METHOD AND SYSTEM FOR AUTOMATICALLY MODELLING REGISTERS FOR INTEGRATED CIRCUIT DESIGN

[75] Inventors: Milivoje Aleksic, Richmond Hill; Bryan S. Sniderman, Thornhill, both of Canada

[73] Assignee: ATI Technologies, Inc., Thornhill, Canada

[21] Appl. No.: 08/899,521

[22] Filed: Jul. 24, 1997

[51] Int. Cl.[6] ..................................................... G06F 17/50
[52] U.S. Cl. ...................................... 395/500.19; 395/702
[58] Field of Search ..................................... 364/578, 489, 364/490; 395/500, 500.02, 500.19

[56] References Cited

U.S. PATENT DOCUMENTS

| | | | |
|---|---|---|---|
| 5,278,769 | 1/1994 | Bair et al. | 364/490 |
| 5,526,517 | 6/1996 | Jones et al. | 395/600 |
| 5,586,046 | 12/1996 | Fedlbaumer et al. | 364/490 |
| 5,870,308 | 2/1999 | Dangelo et al. | 364/489 |

OTHER PUBLICATIONS

Jain, "A Comprehensive Pre–RTL IC Design Methodology," Proceedings of the 1995 Verilog HDL Conference, pp. 119–126, Mar. 1995.

*Primary Examiner*—Eric W. Stamber
*Assistant Examiner*—Samuel Broda
*Attorney, Agent, or Firm*—Markison & Reckamp, P.C.

[57] ABSTRACT

An integrated circuit modeling system facilitates automatic design of register based hardware devices by generating major pieces of the development outputs from a single input, such as a single register specification source file. The modeling code is kept coherent for all major phases of design and testing. The register specification source file contains all the register information about the device being developed. For example, each register defined in the file contains information about its offset (within its register space), access permissions, size, and field specifications. The system uses a series of associated pre-stored modeling templates in different programming languages, that access the register specification source file and automatically generate behavioral model register code and IC simulation code.

24 Claims, 11 Drawing Sheets

```
/*
 * ASIC Register file for Sample ASIC: Rev A
 *
 * Register Spec: SM-A
 * Document No.:
 *
 */
// ==== ASIC Disclaimer====
ASIC_DISCLAIM_START ASIC_NAME "SAMPLE-A"
ALT_NAME "Sample Asic"
DESCRIPTION "Multi-Sample Device "
ASIC_DISCLAIM_END //====Memory Model =====
MEMORY_MODEL_START
NUM_REG_SPACES CFG 1
NUM_REG_SPACES IO 1
NUM_REG_SPACES MM 1

DEFINE_REG_SPACE CFG 0
(
NAME   = "Sample CFG Space";
IRQ    = REQUIRED ENABLE;
);

DEFINE_REG_SPACE IO 0
(
NAME   = "Sample IO Registers";
CFG_REGSPACE = 1
SIZE   = 16
PLACEMENT = BLOCK;
);

DEFINE_REG_SPACE MM 0
(
NAME = "Sample Memory Mapped
                Registers";
CFG_REGSPACE = 0
PREFIX = "SMA"
SIZE = 4MB;
PLACEMENT = BLOCK ALIGN 4 MB;
);

MEMORY_MODEL_END

// ==== stream description====
STREAM_DESC_START

NUM_INPUT_STREAMS 1
NUM_OUTPUT_STREAMS 1

DEFINE_INPUT_STREAM 0
(
STREAM_NAME = "Game Port In";
STREAM_TYPE = DATA_STREAM;
STREAM_FORMAT = "TBD";
STREAM_TOKEN = "GP_IN";
);

DEFINE_OUTPUT_STREAM 0
(
STREAM_NAME = "Game Port Out ";
STREAM_TYPE = DATA_STREAM;
STREAM_FORMAT = "GP";
STREAM_TOKEN = "GP_OUT";
);

STREAM_DESC_END

// ===== signal description ====
SIGNAL_DESC_START

NUM_INPUT_SIGNALS 1
NUM_OUTPUT_SIGNALS 0

INPUT_SIGNAL = "gnt";

SIGNAL_DESC_END

// ====vhdl register blocks ====

VHDL_MODEL_START

NUM_VHDL_BLOCKS 1

DEFINE_VHDL_BLOCK 0
(
VHDL_NAME    = "host";
VHDL_ADDR_BUS = 32;
VHDL_ADDR_DEC = 1
VJD_DATA_RD_BUS = 32
);
VHDL_MODEL_END // ==== Register Defns ====

VHDL_BLOCK 0
regIO  RS:0   0x06  8 IO (
   mar    7:0    NUM;
);
regMM  RS0  0x10  32 MM (
  HOSTRD   0  ALPHA ("No data", "Data");
  DSPRD    1  ALPHA ("No data", "Data");
  DBHIOSTRD 2 ALPHA ("No data", "Data");
  DBDSPRD  3  ALPHA ("No data", "Data");
  id      7:4   NUM;
);

VHDL_BLOCK_END
```

FIG. 6A

```
/*
* AR_DC_CXX
*
* (c) ATI Technologies Inc
*
* Register direct field connection decoder functions
*
* $$File: /proj/bmg/devel_bryans/devices/reg/sample-a.reg
* $$ASIC Name: SAMPLE A
* $$Regs Date: 05/29/97 15:40:43
* $$Conv Date: 05/29/97 15:40:50
*
*/ include <fstream.h>
include "tooltype.h"
#include "regbase.h"
#include "ar_glob.h"
#include "ar_dc.h"

//
// Register Files
//
//"CORE" Direct register files
CRegisterFile ioRF_CORE(1, ioRF_CORE_RS0_decode);
CRegisterFile mmRF_CORE(1,mmRF_CORE_RS0_decode);

//
// Direct Decoder Functions
//

//******
//****BLOCK: 'CORE'
//*****

// -- ioRF_CORE_RS0_decode () ======
USHORT ioRF_CORE_RS0_decode
(USHORT addr_mode, ULONG offset,
BYTE cntl, BYTE forceFla USHORT index = NON_EXIST_i;

switch (offset)
(
    case regIO_off_0;
    index= regIO_i;
    break;

default:
    index = NON_EXIST i;
    break;
)
if (index == NON_EXIST_i) (
    err_bag.open(EADINDEX);
    err.bag<<"Register Mode 0: ";
    if (cntl == READ_REG)
        err_bag<<"try to read from the ";
    else
        err_bag<<"try to write to the ";
    err_bag<<"address ->";
    err_bag<<offset;
    err_bag.close();
)

return index;
) // ioRF_CORE_RS0_decode ()
// ======

// -- mmRF_CORE_RS0_decode () ======
USHORT mmRF_CORE_RS0_decode (USHORT
addr_mode, ULONG offset, BYTE cntl, BYTE
forceFlags)

USHORT index= NON_EXIST_i;

switch (offset)
(
    case regMM_off_0'
    case regMM_off_0+1
    case regMM_off_0+2;
    case regMM_off_0+3;
        index = regMM_i;
        break;
)

if(index == NON_EXISTi) (
    err_bag.open(EADINDEX);
    err.bag<<"Register Mode 0: ";
    if (cntl == READ_REG)
        err_bag<<"try to read from the ";
    else
        err_bag<<"try to write to the ";
    err_bag<<"address ->";
    err_bag<<offset;
    err_bag.close ();
)

return index;
) // mmRF_CORE_RS0_decode ()
//=====
// Indirect Decoder Functions
//=====
```

FIG. 6B

```
#if !defined (_AR_DC_H)
#define _AR_DC_H

//
//              AR_DC.H
//
// ( ) ATI Technologies Inc
//
// *Register direct connection header file
// * NOTE: This source is automatically generated and should
//   not be hand modified.
// *
// * $$File: /proj/bmg/devel_bryans/devices/reg/sample-a.reg
// * $$ASIC Name: SAMPLE-A
// * $$Regs Date: 05/29/97 15:40:43
// * $$Conv Date: 05/29/97 15:40:50
//
// Register Space Mapping
//
//Configuration Register Spaces
// CFG RS 0: Sample CFG Space
//
// I/O Register Spaces
//    IO RS 0: Sample IO Registers
//
// Memory Mapped Register Spaces
//    MM RS 0: Sample Memory Mapped Registers
//
// Internal Register Spaces
//
//=========
// Block Definitions
//=========

//=========
// Decoder Function Prototypes
//=========

USHORT cfRF_CORE_RS0_decode
 (USHORT, ULONG, BYTE, BYTE);
USHORT ioRF_CORE_RS0_decode
 (USHORT, ULONG, BYTE, BYTE);
USHORT mmRF_CORE_RS0_decode
 (USHORT, ULONG, BYTE, BYTE);

//=========
// Decoder Array Prototypes
//========= typedef USHORT (*pDecodeFn)
 (USHORT add_mode, ULONG offset,
  BYTE cntl, BYTE fcntl);
extern pDecode Fn pIO_CORE_Decoder[];
extern pDecodeFn
pMM_CORE_Decoder[];

//=========
// Definitions
//=========

// address for nonexistent regs.
#define NON_EXIST i 0

// define all address modes
#define MODE_OFF_0 0

//=========
// Register Definitions
//=========

//******
//**Block: 'CORE'
//******

// **** Configuration: Register Definitions ****

// **** I/O: Register Definitions ****

// reg IO
#define regIO_off_0 0x0006
#define regIO_I 1
#define regIO_mar 1

// **** Memory-mapped: Register Definitions ****
// regMM
#define regMM_OFF_0 0x0010
#define regMM_i 1
#define regMM_HOSTRD 1
#define regMM_DSPRD 2
#define regMM_DBHOSTRD 3
#define regMM_DBDSPRD 4
#define regMM_id 5

// ** Internal: Register Definitions ** endif // _AR_DC_H
```

FIG. 6C

```
-- host Address Decoder -- RTL Architecture define NOARITH
include <vhdl.h>

...

architecture RTL of hostadec is signal DEC_regIO   : std_ulogic;
signal DEC_regMM   : std_ulogic;

begin

...

DECODE_process: process(iOFFSET)
  procedure zero_decodes is
  begin
    DEC_regIO  <= '0' after 1 ns;
    DEC_regMM  <= '0' after 1 ns;
  end zero_decodes;

begin zero_decodes;

case iOFFSET is
    when others =>
      zero_decodes;
  end case;
end process DECODE_process;

...

RESET_REGS_process: process
begin
  wait until (iBIT_CLK'event and iBIT_CLK = '1');
end process RESET_REGS_process;

...

WRITE_ENABLES_block: block
  signal WE: std_ulogic;
begin
  WE <= iWE_GENERIC and iBIT_CLK after 1 ns;

oWE_regIO   <= (DEC_regIO
  d WE) or iRST after 1 ns;
  oWE_regMM   <= (DEC_regMM
  d WE) or iRST after 1 ns;

end block WRITE_ENABLES_block;

...

READ_ENABLES_block: block
begin
  oRD_regIO   <=DEC_regIO
  iRD_GENERIC after 1 ns;
  oRD_regMM   <= DEC_regMM
  iRD_GENERIC after 1 ns;

end block READ_ENABLES_block;

end RTL;
```

FIG. 6D

```
#ifdef ENT
-----
-- host Address Decoder -- Entity
----- define NOARITH
include <vhdl.h>
-----
-----
entity hostadec is
#else
component hostadec
#endif
    port (
        iBIT_CLK          :  in std_ulogic;
        iRST              :  in std_ulogic;

iOFFSET           :  in std_ulogic_vector(31 downto 0);
        iWE_GENERIC:      in std_ulogic;
        iRD_GENERIC:      in std_ulogic;

-- Write Enables for Latches
        oWE_regIO         :  out std_ulogic;
        oWE_regMM         :  out std_ulogic;

--Read Decodes for RDMUX
        oRD_regIO         :  out std_ulogic;
        oRD_regMM         :  out std_ulogic
    );
#ifdef ENT
end hostadec;
#else
end component;
#endif
```

FIG. 6E

METHOD AND SYSTEM FOR AUTOMATICALLY MODELLING REGISTERS FOR INTEGRATED CIRCUIT DESIGN

The invention relates generally to methods and systems for designing and modeling integrated circuit designs and more particularly to methods and systems for designing and modeling register sets in ASIC designs.

BACKGROUND OF THE INVENTION

Many integrated circuits are comprised of register sets and integrated functionality. For example, hardware device add-ons in the personal computer (PC) system environment, such as graphic accelerator chips, contain integrated functionality that are accessed through register sets. A particular function in a hardware application specific integrated circuit (ASIC) is activated by accessing the correct associated register. The hardware defines its register space within the PC environment that maps its internal functions through an external host bus interface. The exact placement of the registers is determined by the space requirements of the ASIC added to the PC system.

The registers themselves provide views or windows to internal hardware storage elements, typically flip-flops (flops) or latches, which are referred to herein as "fields". The grouping of the various fields form registers (up to 32-bits in length in conventional PC architecture). By reading or writing to the registers, the internal fields are externally accessed and programmed. The action of accessing these fields causes the hardware to be set in a particular manner and ultimately to perform the desired associated function. Since the grouping of these fields can be arbitrary, for programmer convenience sake, fields associated with similar functionality and meaning are typically grouped together into common register views. This occurs as part of defining the register specification for a particular hardware device. Often, the same fields are mapped or aliased into various registers in order to provide a more flexible programming model. In this scenario, multiple methods are provided to access a single field within the ASIC. Thus, the registers that are formed contain one or more fields (typically, an array of associated fields) that can be read or written to in order to program the hardware device to perform some functionality.

Some fields are passive while others are active. The passive fields simply act as storage to keep track of user defined parameters (such as the length of a line to draw, in the case of a graphics accelerator). Other active fields are intended for initiating an action (such as actually drawing a line). The action that is initiated uses the data and parameters set in the passive, storage fields to define the exact behavior of the action. In this example, the line that is drawn will be as long as the length specified in the designated "length" field (other parameters, such as direction, color and slope also influence the line drawing action).

In the development process, the behavior of new hardware devices is typically first defined. This is usually followed by defining the registers for the device that provide access to the hardware's internal functionality. The design of the hardware devices is typically a long, arduous task that requires exact attention to detail on all levels in the design. At the most fundamental level, the design has to meet to functional specifications. Before any design can be manufactured, it must be verified that it satisfies all specifications. The verification is typically realized through extensive computer simulation and comparison with a reference set of results, referred to herein as a 'regression suite' of tests. In the course of generating this regression suite, it may be necessary to build a software behavioral model of the device being tested.

This behavioral model mimics the behavior of the device under design down to the functional level. The behavioral model must precisely resemble the device from the external host's (such as a CPU) point of view. It is this requirement that forces the software behavioral model to adhere to the register specification associated with the device. Since a device may consist of hundreds of registers, each potentially with multiple fields, the development and maintenance of the software behavioral model and hardware device is complicated, time consuming, and often inefficient. Therefore, there exists a need for automating and simplifying the process of developing a suitable software behavioral model.

In conventional ASIC hardware design processes the different hardware device design phases can be characterized as follows: (1) an initial device concept phase consisting of defining the product purpose, scope, and usefulness; (2) a device definition phase; and (3) a design implementation phase.

The device definition stage contains two branches which, for the most part, execute in parallel with strong interaction to the initial design concept phase. The two branches are typically architectural and algorithmic selection and programming of the behavioral model. The architectural and algorithmic selection is generally accomplished through formal methods and/or by functional modeling (behavioral modeling) and computer based hardware simulation of the device. The programming of the behavioral model entails specifying the host register interface (i.e., register specification) that meets two conditions: (i) all of the required functionality of the device is accessible through the registers, and (ii) the register layout provides a convenient method for software developers for accessing the inherent functionality in the device. The development of the programming model is often an iterative stage since its usefulness and effectiveness cannot be fully determined until software is actually written to exercise the programming model.

The design implementation stage involves implementing the actual design as specified, typically using a Hardware Description Language, such as VHDL or VERILOG to simulate operation of the hardware design. The design implementation phase often involves many iterations and modifications to both the functionality and register specification of the device. This is strongly dictated by the technology, resources, and schedule for completing the design. As a result, the software behavioral model constantly undergoes often drastic changes in an effort to keep pace and maintain consistency with the ever changing hardware design.

In conventional development processes, the different phases of design are often decoupled and assume the design implementation phase will exactly follow the specification. The software behavioral model is typically written and updated manually according to the initial specification, thought to be static. However, due to the iterative nature of design, the software model required extensive changes, particularly at the register interface level, in order to satisfy the new design requirements. This generally involves excessive overhead and unnecessary work and often quickly lead to an inconsistent model at the detailed register level.

Therefore, there exists a need for an ASIC design system in which the process of software behavioral model development is mapped into all the stages of design in an automated manner in order to efficiently and consistently produce a software modeling interface that precisely reflects the state of the device under design.

BRIEF DESCRIPTION OF THE DRAWINGS

The features of the present invention together with the advantages thereof, may be understood by reference to the following description taken in conjunction with the accompanying drawings wherein:

FIG. 6A is an illustrative example of a register specification source file for use by the system for automatically modeling registers for integrated circuit design in accordance with the invention;

FIGS. 6B and 6C is an illustrative example of behavioral model register C++ code generated from the register specification source file of FIG. 6A by the system for automatically modeling registers for integrated circuit design in accordance with the invention;

FIGS. 6D and 6E an illustrative example of hardware design register VHDL code generated from the register specification source file of FIG. 6A by the system for automatically modeling registers for integrated circuit design in accordance with the invention.

DETAILED DESCRIPTION OF THE INVENTION

In order to satisfy the requirement for automatically generating a software register model that is consistent during the design stages, the disclosed invention automatically generates behavioral model register code and automatically generates hardware design simulation code from a common input or source to insure that any changes are automatically included in each phase of design. In a preferred embodiment, the common input source is a single text based register specification source file. The register specification source file contains all of the pertinent register information about the device being developed. For example, each register defined in the file contains information about its offset (within its register space), access permissions, size, and field specifications. The disclosed system and method uses a series of associated pre-stored modeling templates in different programming languages, that access the register specification source file and automatically generate behavioral model register code and hardware simulation code.

The behavioral model register code and hardware simulation code represent modular register layers that are separate layers from a functional portion of the model, which contains the internal fields. The two layers are then joined by connecting them in a predefined, universal manner using a connection template (file) that is also automatically generated from the same common register specification source data or .REG file. The system also performs a merging operation that merges current register layer data with a new register specification source file and preserves a previous state of the code by adding only new register data model code and deleting only obsolete register model code to reduce programming time and to maintain a more coherent design process.

Figure 1:
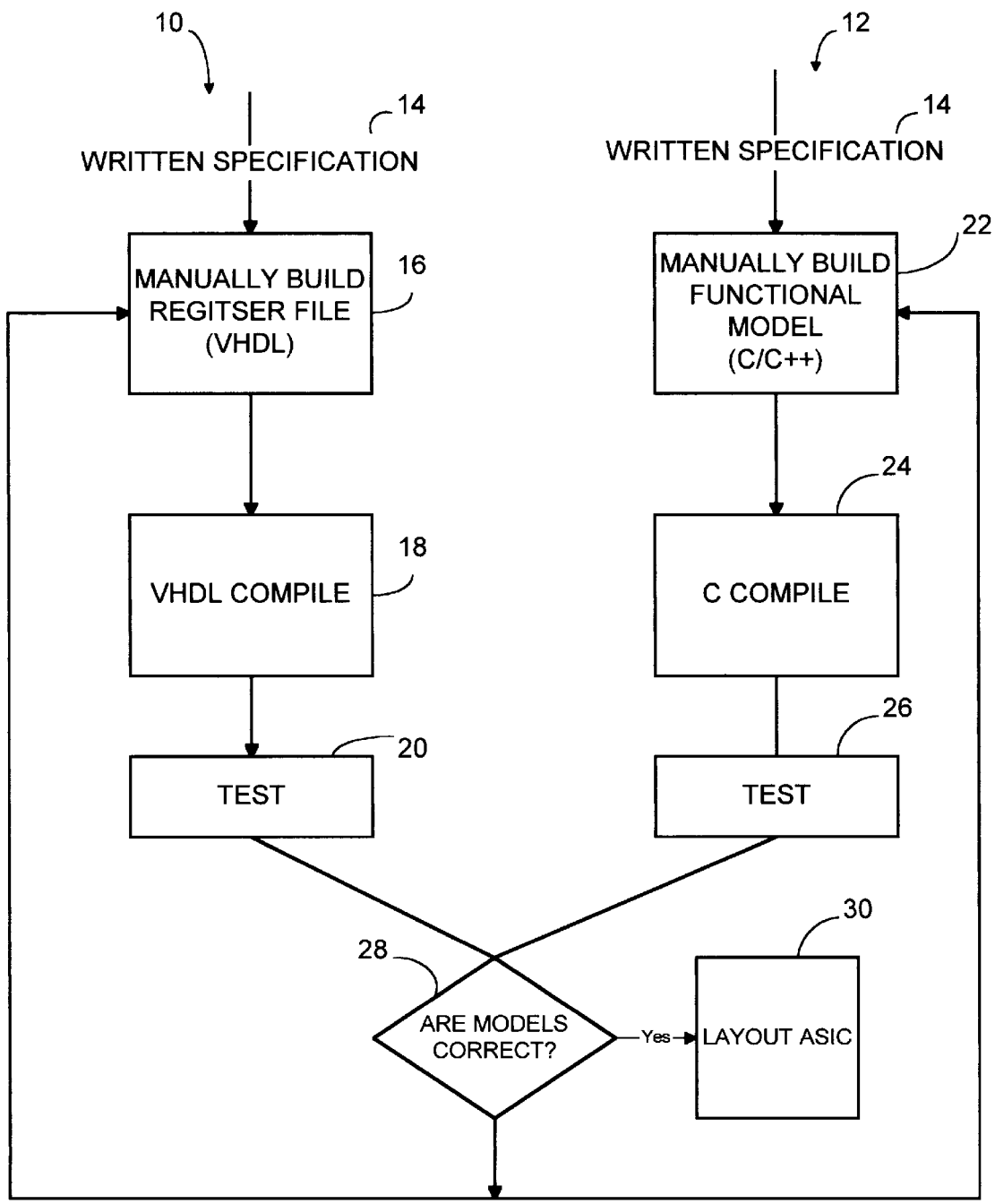
FIG. 1 is a flow diagram generally depicting a conventional integrated circuit design process.

FIG. 1 depicts a simplified block diagram of a conventional integrated circuit design process having two parallel development paths indicated as path 10 and path 12. Path 10 is a design path for generating hardware design simulation code for an integrated circuit design. Path 12 shows a design process for generating behavioral model register code for the same integrated circuit. As shown, each design team reviews a written specification 14. Each design team then manually builds respective software models in the form of code. The hardware design simulation code is manually built or coded using VHDL or some other hardware coding design language. This is shown by block 16.

Once the hardware design simulation code is manually generated, it is subsequently synthesized as shown by block 18 by being run through a VHDL compiler. As shown in block 20 the compiled software hardware design simulation code is tested using a test program generated to verify that the register layout and functionality as set forth in the hardware design simulation code accurately meets the written specification 14.

Similarly, behavioral functional model code is also prepared based on the same written specification 14 as shown by block 22. This is an iterative process and behavioral model register code can be written in C/C++ or any suitable coding language. If a change is done in the hardware design simulation code, it must also be implemented in the behavioral model code so that there is continuity between the behavioral model testing and the hardware simulation testing. Iterations become problematic since the code for the models has to be rewritten for each new iteration.

As shown in block 24, once the behavioral model is coded, it is then compiled. The compiled behavioral model register code is then tested against the same test program parameters written to verify that the behavioral model meets the requirements of the written specification 14 as indicated by block 26. The test results are typically compared to determine whether the models are correct as indicated in block 28. If the models compare accurately to one another and meet the written specification, the ASIC may be laid out as indicated in block 30. If however the models are not correct, the design process is repeated wherein the hardware (register) simulation code is again manually edited as shown by block 16 and the behavioral functional model is also manually edited as shown in block 22 and the steps are repeated until each of the models accurately reflects the written specification 14. Hence, these different phases of design are decoupled and assume that the design implementation phase exactly follows the specification 14.

The testing 20 and 26 is performed because in the simulation and testing phase of the device under design, the hardware does not actually exist Only an exact model down to the gate level with all physical information of the device as described in VHDL exists. To ensure a reliable, stable, and ultimately functionally correct final product, regression tests have to be run through the simulated hardware device and also through the behavioral functional model (C/C++ model) in order to provide reference (functional) simulation to ensure a functionally correct design.

Figure 2:
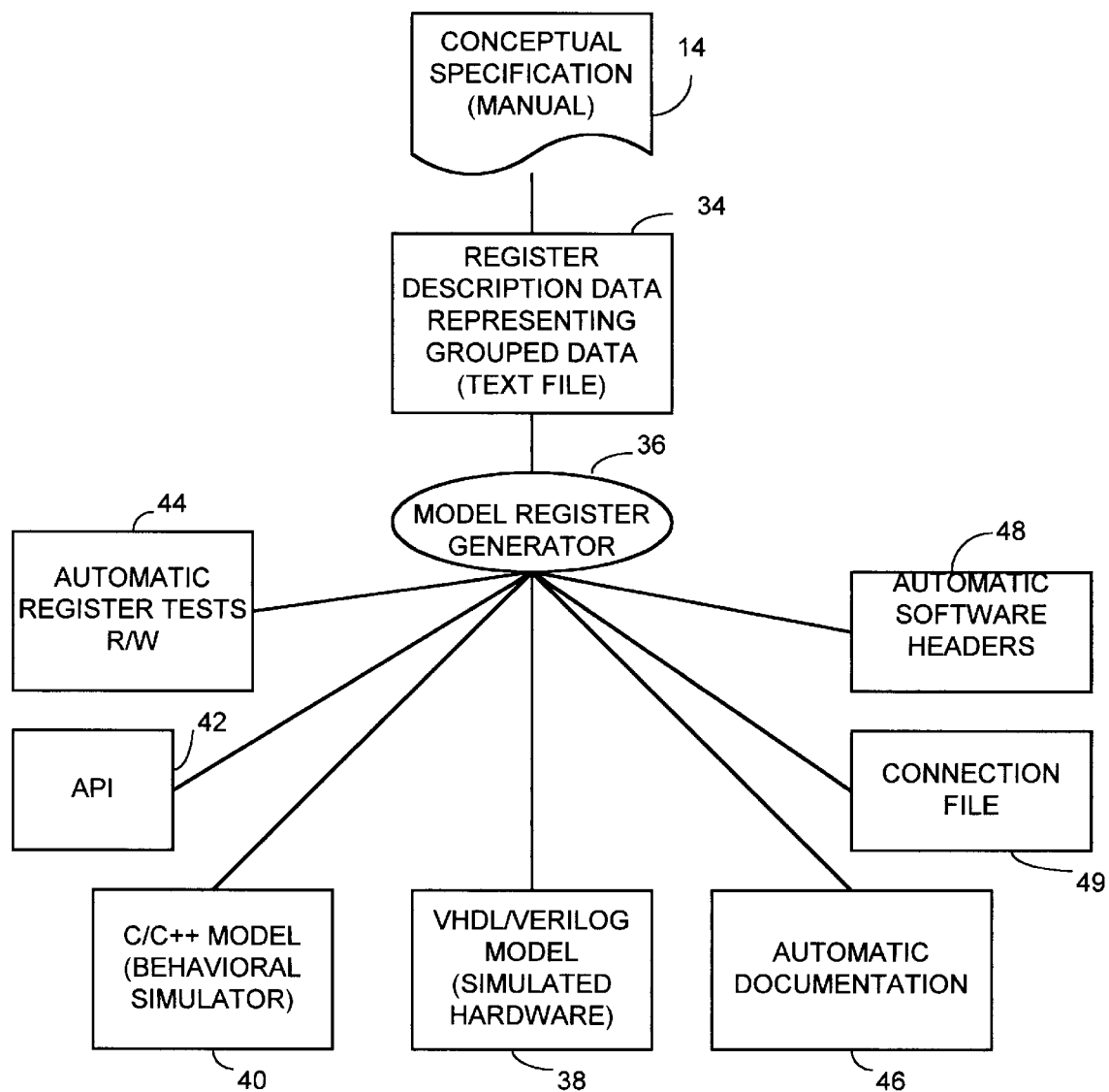
FIG. 2 is a block diagram generally depicting one example of a system for automatically modeling registers for integrated circuit design having one input source to a model register generator for automatically generating outputs from the source in accordance with the invention.

FIG. 2 shows an input/output based block diagram of an embodiment of a system 32 for automatically modeling registers that includes common register description source data 34 which is preferably description data representing grouped register data in the form of a text file. The register description source data 34 serves as the source data for the automatic generation of hardware design simulation code and behavioral model register code (C/C++) to efficiently reduce design time and errors introduced in a conventional design process.

The system 32 for automatically modeling registers for use in integrated circuit design also includes a model register generator 36 which accesses the common register description source data 34 to automatically generate a multitude of useful design components and tools. These include the automatic generation of hardware design simulation code 38 (written for example in VHDL), behavioral model register code 40 (written for example in C/C++), application interface layer code 42 (when needed), automatic register tests 44, automatic integrated circuit documentation 46, automatic software header information 48 for use by peripheral software modules and connection templates 49 to facilitate automatic merging and revision of the generated code.

The model register generator 36 reads in register description source data 34 referred to herein as a .REG file, and extracts register information stored in the .REG file. The register description source data 34 is a text file having groups of data organized as desired.

Figure 3:
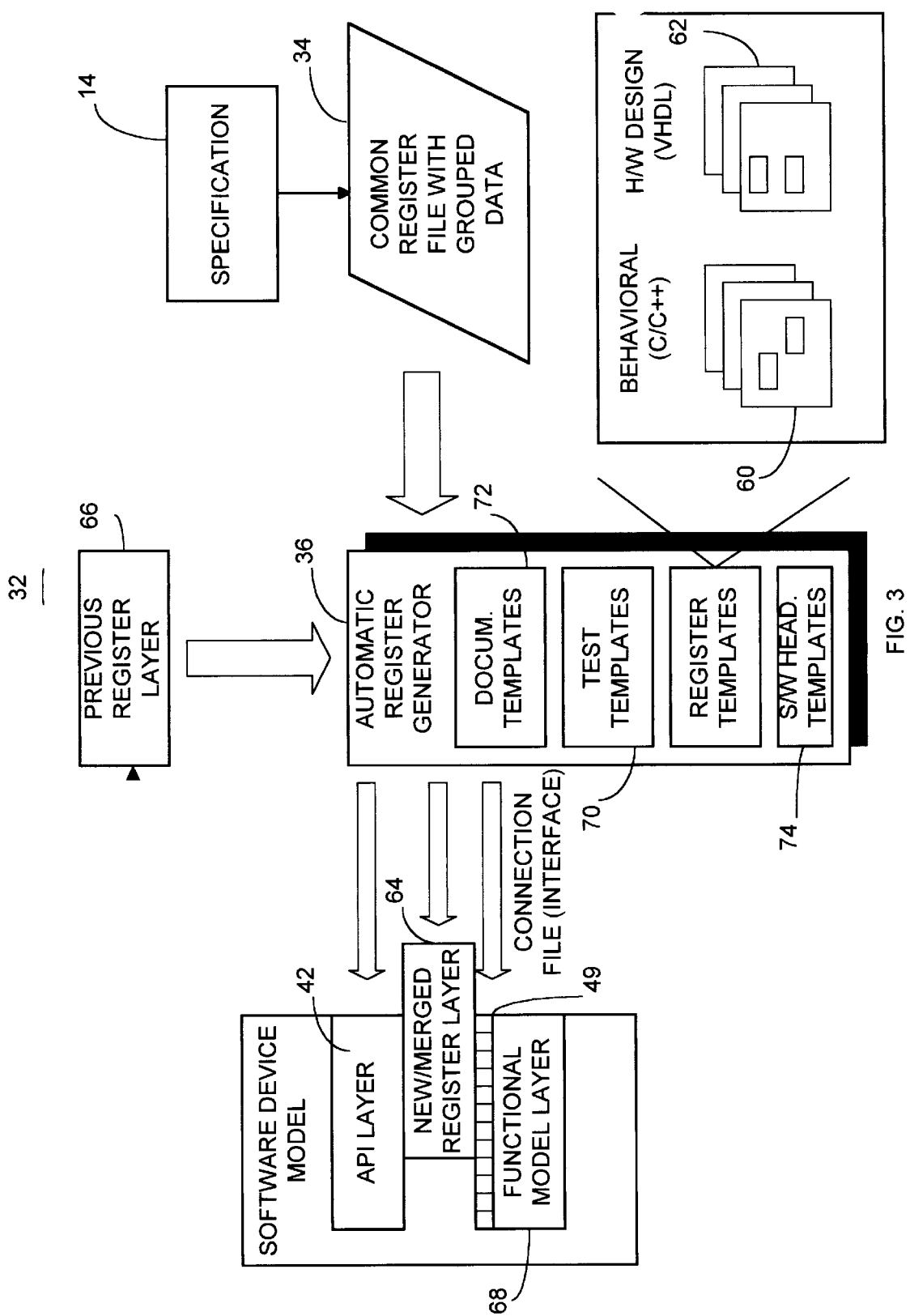
FIG. 3 is a block diagram depicting in more detail, one example of a system for automatically modeling registers for integrated circuit design in accordance with the invention.

Referring to FIG. 3, the model register generator 36 generates a number of outputs from the .REG file. The model register generator 36 may be a software based module written in C/C++, resident in computer memory run by a computer. The model register generator 36 first generates the application interface layer (API), such as the host bus decoder information. The model register generator 36 also generates a coded register layer that, in operation, interfaces with the device API layer through the host decoder information. The register layer defines the characteristics of each register block. A register block includes for example register block decoders and associated registers (including register fields). The hardware design simulation code 38 or the behavioral model register code 40 forms the respective register layer. The hardware design simulation code 38 and the behavioral model register code 40 is generated based on the register specification source data, hence the register layer is also based on the register specification source data 34.

The model register generator 36 also automatically generates the connection templates 49 or files to interface between a register layer and a user-defined functional model layer. The functional model layer is program code that dictates how to use the information stored in the registers in the register layer to perform desired functions of the actual ASIC. Hence, the functional model layer is program code written to emulate the functional requirements of the ASIC. For example, where the ASIC is a graphic accelerator chip, the functional model layer may have code to draw a line based on coordinate values stored in registers coded in the register layer. The register layer provides the ability to pass information to the functional model layer.

The connection template 49 maps which functional model fields are associated with which register fields, and which functional model fields belong to which register. By way of example, fields in the functional model layer for drawing a line are mapped to register fields in the register layer containing data for use in drawing lines.

The model register generator 36 also automatically generates the software headers 48, the model documentation 46 and the register tests 44. The behavioral model register code 40 and hardware design simulation code 38 are compiled and tests from the register test 44 are used to exercise each model. Standard tests are also run on each of the behavioral model register code 40 and hardware design simulation code 38.

As shown in FIG. 3, the system 32 for automatically modeling registers for integrated circuit design stores a set of predefined behavioral model register code templates 60 which are in a same language as (C/C++) as the behavioral model register code. The system 32 for automatically modeling registers for integrated circuit design also stores, in memory, a second set of predefined register code templates 62 which are in a same language as the hardware design simulation code (VHDL). These templates include lines of code in the respective languages with unpopulated data fields. The register code templates 60 are associated to effect a desired relationship among register blocks and registers within the blocks. Likewise, register code templates 62 are also associated to one another as required to effect a proper relationship among register blocks and registers and decoders for the integrated circuit. Using object oriented database methods, the automatic register generator 36 accesses the register specification data source 34 to populate the unpopulated data fields for a given register code template 60 or 62 as required to generate a given API layer 42, register layer 64 or a connection template 49.

It will be recognized that the API layer 42 need only be automatically generated once for a given ASIC since this is the host interface layer. Design changes can occur throughout the design process so that the register layer 64 formed by each set of behavioral model register code 40 and hardware design simulation code 38 may change. Therefore, a new register layer is generated each time a change is made to the .REG file. Where a previous register layer 66 exists, the automatic register generator 36 determines differences in the previous register layer and the merged register layer 64 to preserve code that can still be used with the new .REG file and also automatically deletes obsolete code and adds new code to form the new register layer. Since the hardware design simulation code 38 is automatically generated from the automatic register generator 36, a change to the common register file 34 causes a new hardware simulation model 38 (and vice versa) to be generated thereby keeping the major component of the design process coherent. The automatic register generator 36 also generates the connection template 49 which allows the register layer 64 to interface with the user-defined functional model layer 68.

In addition to the register templates 60 and 62, the automatic register generator 36 also includes predefined register test code templates 70 containing unpopulated register test code written in a language suitable for generating automatic register tests 44 for testing the VHDL code and the behavioral model code. Also, documentation templates 72 containing unpopulated lines of text are used to generate the automatic documentation 46. Software header templates 74 containing unpopulated software header information in suitable languages generate the software headers 48. Through conventional database programming, each of the templates obtains data from the single register specification source file to populate missing desired data.

Figure 4:
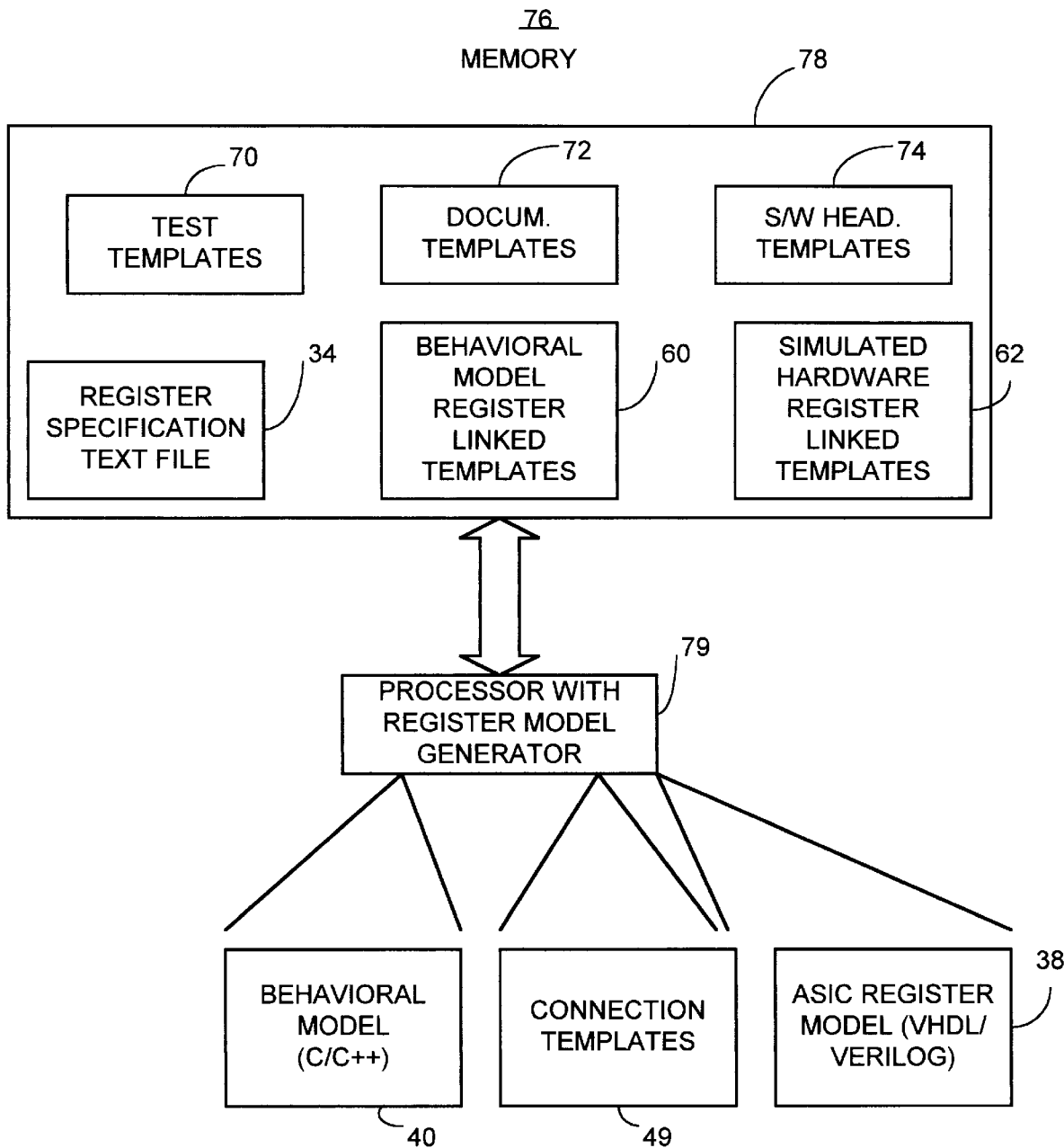
FIG. 4 is a block diagram depicting a computer system with memory and a processor serving as one example of a system for automatically modeling registers for integrated circuit design in accordance with the invention.

FIG. 4 shows a hardware system for implementing the system 32 for automatically modeling registers for integrated circuit design 76 which includes memory 78 and a processor 79 for storing and processing requisite template and file information to automatically generate the behavioral model register code 40 and the hardware design simulation code 38. The processor 74 may be any suitable computer and is preferably a workstation based computer system with suitable VHDL, C and C++ compilers. The memory 78 may be any associated memory accessible by the processor 79 and includes the object oriented databases having associated templates (linked templates). The processor 79 also compiles the hardware design simulation code 38 and behavioral model register code 40 for exercise by the automatic tests 44.

Figure 5:
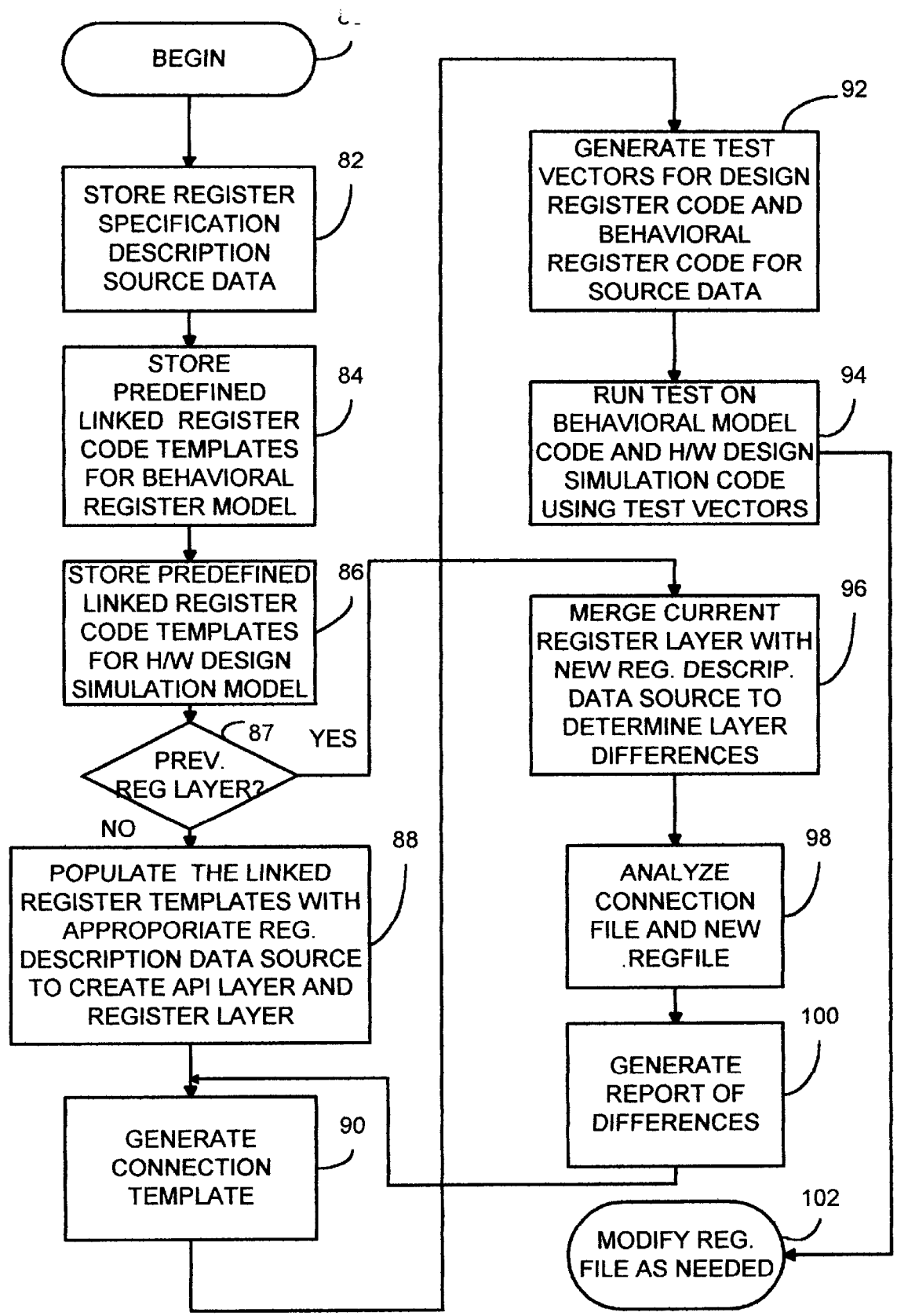
FIG. 5 is a flow diagram depicting one example of a method for automatically modeling registers for integrated circuit design in accordance with the invention.

Referring to FIG. 5, the system 76 begins in block 80 by receiving user entered register specification description source data 34 such as that in the form of FIG. 6A for populating the predefined templates. The system 70 then stores the register specification description source data 34 in memory as indicated in block 82. The system 70 also stores the unpopulated predefined associated register code templates 60 for the behavioral model register code as shown in block 84 and the unpopulated predefined register code templates 62 for the hardware design simulation code as shown in block 86.

In block 87, the system 76 determines whether there is a previous register layer for merging. If there is not, the automatic register generator 36 populates the associated register templates with appropriate register description source data 34 to create the API layer 42. The automatic register generator 36 also populates the associated register templates with appropriate register description source data 34 to create a register layer 64 as indicated by block 88. However, if the API layer 42 was already created, the register generator 36 need only generate the register layer 64.

Once the templates 60 and 62 have been suitably populated, the lines of populated code from each template serve as the behavioral model register code 40 and hardware simulator code 38. The automatic register generator 36 also generates the connection template (file) 49 as shown in block 90, to allow the register layer 64 to interface with functional model layer 68. The connection template 49 facilitates in mapping the register layer to the functional model layer 68 to find the functions for the register layer 64. The connection template contains code that links register fields listed in the .REG file with functional model fields defined by the user in the functional model program code. For example, if a test to test registers X and Y that store X and Y coordinate values is a function defined in the functional model layer as field MODEL X and MODEL Y, the connection template connects registers X and Y with functional model layer fields MODEL X and MODEL Y so the functional model program code can perform the test function using the X and Y registers. The X and Y registers serve as conduits for uniting fields.

With the behavioral model register code 40 and the hardware design simulation code generated, the system 70 compiles the code to be in a form suitable for testing. As indicated in block 92, the automatic register generator 36 pulls register file data from the common register specification source data 34 to populate register test code templates 70 for testing the behavioral model register code 40 and the hardware design simulation code 38. The register test code 44 is automatically generated in a similar manner to the behavioral model register code 40 and the hardware design simulation code 38. Such tests include conventional register tests. The system 70 then runs the tests on the behavioral model register code 40 and the hardware design code 38 using the register test code 44 as indicated in block 94.

Referring back to block 87, where an updated .REG file exists and a previous register layer was created from a previous register specification source, the automatic register generator 36 automatically merges a current register layer 64 with a previous register layer 66 to determine differences in register function and attributes. This is shown in block 96. As indicated in block 98, the automatic register generator 36 performs the merging operation and determines whether there are differences between a current register layer and an updated or new .REG file, by analyzing or merging the contents of the connection files from a current design pass and the contents of the updated .REG file. In generating a new register layer, the merging process preserves a previous state of the code where possible, adds only new register data to the existing code 38 or 40 and deletes only obsolete code to automatically and efficiently generate the new code that conform with the updated .REG file.

Merging is done by the processor 79 serving as the automatic register generator 36, by analyzing updated register description source data and analyzing existing behavioral model code (the current register layer) or existing hardware design simulation code, to obtain data that was in a previous register specification source data file and to determine current register layer connections to the functional model layer. The previous .REG file is nonexistent when an updated .REGfile is created. To obtain data that was in the previous .REG file, the processor 79 analyzes register data and current connection file data in the current connection file that was generated from the previous .REG file and translates the connection file data into a database format common with the database format of the updated .REGfile.

Once translated to a common format, the processor 79 compares the updated register description source data to the obtained data and determined current connections. The comparison determines the registers, register fields, connections and functional model fields that have been removed or added in the updated .REGfile. The processor 79 then uses the register templates to generate new code 38 and 40 (a new register layer) based on the comparison of the updated register description source data and the obtained data and determined current connections. The processor 79 also generates a report identifying detected differences so the operator can readily identify any differences. In, determining the register layer differences based on connection file data, the automatic register generator 36 preserves the previous code and only adds the new code corresponding to new register information that was different based on the new .REG file. The automatic register generator 36 automatically generates a report, identifying detected register differences based on the analysis of the connection file and updated .REG file as indicated in block 100. The automatic register generator 36 then generates the connection template as shown in block 90.

As shown in block 102, a user may manually update the register description source data 34 to make suitable changes after the tests are run, so that the next design phase includes the proper changes. Hence, the testing and design of the model data is done using the register test code and the automatic register generator 36 compares the results of the test to determine behavioral continuity.

The model register generator also automatically generates documentation from the register description source data 34 representing configuration information of the register as represented by the description source data 34. This is done by populating unpopulated documentation templates in a similar manner as the register templates.

FIG. 6A depicts an example of a register specification source file for use in populating the register templates 60 and 62 and other templates 70, 72 and 74. The register specification source data file 34 is a central file in defining the host interface to the hardware device. This file preferably contains a bitfield level description of all of the possible methods of accessing the hardware device through registers. The term 'host' refers to the system architecture that surrounds the hardware device and determines the method of accessing registers available on the hardware device. As known in the art, the hardware device's registers are mapped into the host system according to the host's requirements and limitations.

The register specification source data file 34 contains sections of grouped data. One group of data is register definition information (Register Defns). The register definition information section is the core of the .REG specification file. This section contains the detailed description of every register used in the hardware device. As shown by way of example in FIG. 6A, there are two registers-an I/O register (reg I/O) and a memory mapped register (regMM).

Each register description is comprised of two components: a register header and a register body. The register header contains the name of the register, the relative offset of the register, its size, type, and attributes. The register body provides the details for the different fields that define the register. Each field contains a field name, field range (absolute starting and ending field bit positions), field type, and field attributes.

In FIG. 6A, under the "Regsiter Defns" group, the generic syntax of a register definition looks like:

register header { register body };
where a register header must be followed by a register body (except under special circumstances where in order to provide a short cut in text entry, the register body may be reused to avoid retyping). The register header is composed of the following fields separated by a white-space:
registerName [RS;regspace [,regspace],[regspace N]]
offset,[offset],...] size type attributes
   registerName (reg IO and regMM)
      This field contains ASCII characters that give the register
      a unique name. It is preferable that the register name indicate the
      purpose and meaning of the register.
   offset (0 x 06 and 0 x 10)
      The offset field determines the relative address of the register
      to the base address of registers in a register class.
   size (8 and 32)
      The size of the register determines the number of bits the
      register contains, and ultimately determines the upper boundary
      for the ensuing register body.
   type (IO and mm)
      A register may be one of four types: I/O, memory-mapped,
      configuration, or indirect I/O (Input(Output) Registers:
         Registers that fall under the I/O category are accessible
         through the I/O ports available in the host I/O space.
      Memory Mapped (m) Registers:
         Registers in this category behave like conventional memory.
      Configuration Registers:
         These registers are special purpose configuration registers
         used to configure the system according to specifications.
         Generally, the method of access to these registers may vary,
         but often the system must be placed in a 'configuration
         state' in order to gain access to these registers. As with
         the other types of registers, configuration space registers may
         be accessed on the byte, word, or dword (double word) level.
   Indirect Registers (not shown):
      Indirect registers are a method of accessing an internal store
      of registers by indexing into an internal table of registers
      and reading or writing data associated with a particular index.
      In general, these types of registers require two accesses. The
      first access sets up an 'index' register to point to the
      internal or indirect register being accessed. The second access
      consists of reading or writing an associated 'data' register
      to retrieve the information. An index register maybe associated
      with several data registers (one-to-many mapping), while
      each data register may only be teamed with one index register.
      Each index/data register pairing may refer to only one 'group'
      of indirect registers. Several groups' or 'indirect lists'
      of indirect registers may be defined by grouping indirect register
      together. The particular method of accessing an indirect register
      depends on the particular mapping of the index and data registers
      (i.e. I/O or memory mapped).
   attributes
      This field determines the register's attributes, such as read
      only (RO), write only (WO), read and write (R/W), read trigger
      (TREAD) or write trigger (TWRITE). In FIG. 6A, no indication means registers are read and write registers.
The register body follows the register header and is enclosed within '{ regBody }:'. Each entry within the register body is a register field definition consisting of the following components:
      fieldName fieldRange fieldType fieldAttributes;
The number of fields per register are limited by the size of the register. Register fields can be defined in any order within a register as long as any part of a field is not defined more than once.
   fieldName (HOSTRD, DSPRD, mar...)
      This field contains alphanumeric characters that give a unique
      name to the register field.
   fieldRange
      The fieldRange defines the starting and ending bits in the
      register that contain the particular field being defined.
      Register bits are numbered from 0 to (n−1), where '0'
      is the least significant register bit, and 'n−1' is
      the register size minus one. For example, a 16-bit register
      contains bits numbered 0–15. The syntax of the fieldRange
      as shown in FIG. 6A is as follows:
         frMaximum : frMinimum (7:4)
      Where frMaximum defines the maximum (highest) field bit
      position, and frMinimum defines the minimum (lowest) field
      bit position.
   fieldType (ALPHA, NUM)
      The fieldType determines the type of field being defined.
      For example possible types of fields include: numeric,
      alphanumeric, fixed numeric, index field, data field.
      NUM [fieldAttibutes]
      The NUM field type causes all output data, such as register
      names, register locations and the attributes of the registers
      and fields, to be written as numeric data. This output data
      provides feedback to a user as to the register information
      that has been access by the model.
      ALPHA {alphaList} [fieldAttributes]
         The alphanumeric field allows the register layer code
         to translate field data to a corresponding alphanumeric
         description of its value. The alphaList contains a list
         of alphanumeric descriptions that have a unique
         correspondence to specific field values. The alphaList
         is analogous to the enum statement found in C
         programming language. The syntax of the alphaList
         may be as follows:
            {"alpha description 1"[=nn-], "alphadescription 2"
         [=xx], . . . }, where nn, xx... assign a particular field
         value to an alpha description.
   FIX value [fieldAttributes];
      The fixed field assigns a fixed value to the field.
      This may be useful when a read back from the field
      is always a constant or hard coded value.
   INDEX indexLabel indirectList [fieldAtrributes] (not shown)
      The index field type defines a field to behave like
      an index. In this type, the value of the field acts
      as an indirect register lookup for corresponding data
      fields, which are associated to this index field. The
      indexLabel provides a unique alphanumeric label for
      this field which is used for associating data fields.
   DATA indexLabel [fieldAttributes] (not shown)
      The data field type defines a field to have attribute

```
            data to an internal indexed register, as pointed to
            by an associated index field. The indexLabel
            determines which index field the data field is asso-
            ciated with. Preferably, there is no restriction as
            to where an index field is defined as long as its
            indexLabel is defined within the same .REG file.
    fieldAttributes
            The field attributes are responsible for defining specific
            attributes of a register field. There are some attributes
            associated with each field defined, for example:
    R               - field is readable
    W               - field is writeable
    DEF = value     - define a default value for a field
    X               - indicates a particular field is derived from
                      an external source
    DB              - indicates a particular field is double buffered
```

In FIG. 6A, no listing of field data attributes indicates that the register field default is a read and write register.

It is preferred that when registers are only distinguishable by their address offset and register type, the registers should be defined as one instance of a detailed register body and should be attached to multiple registers. A restriction to this approach is that all floating register heads must be the same size as the master register with the detailed body definition, and the master register should be defined prior to the alias registers. In any case, register aliasing, accelerates the process of producing a hardware device register file and serves to minimize any mismatch errors that may occur during upgrades or maintenance when one or more similar registers require modification. The syntax for a register defined as an alias to another fully defined register may be:

register header ALIAS=regAliasName;

For an aliased register, the register header is the same as previously described. However, the register body may be replaced by the keyword 'ALIAS' which allows the newly defined register head to be attached to a surrogate body, as defined in the register regAliasName. This attribute is the actual name of the register, which contains the original copy of the body definition.

FIGS. 6B and 6C depict an illustrative example of behavioral model register code 40 output by the register generator 36 for a direct field connection decoder based on the register description source data 34 (.REG file) of FIG. 6A. Similarly, FIGS. 6D and 6E show an illustrative example of hardware design simulation code 38 (written in VHDL) output by the register generator 36 corresponding to the C/C++ code of FIGS. 6B and 6C based on the register description source data 34 (.REG file) in FIG. 6A.

Figure 7:
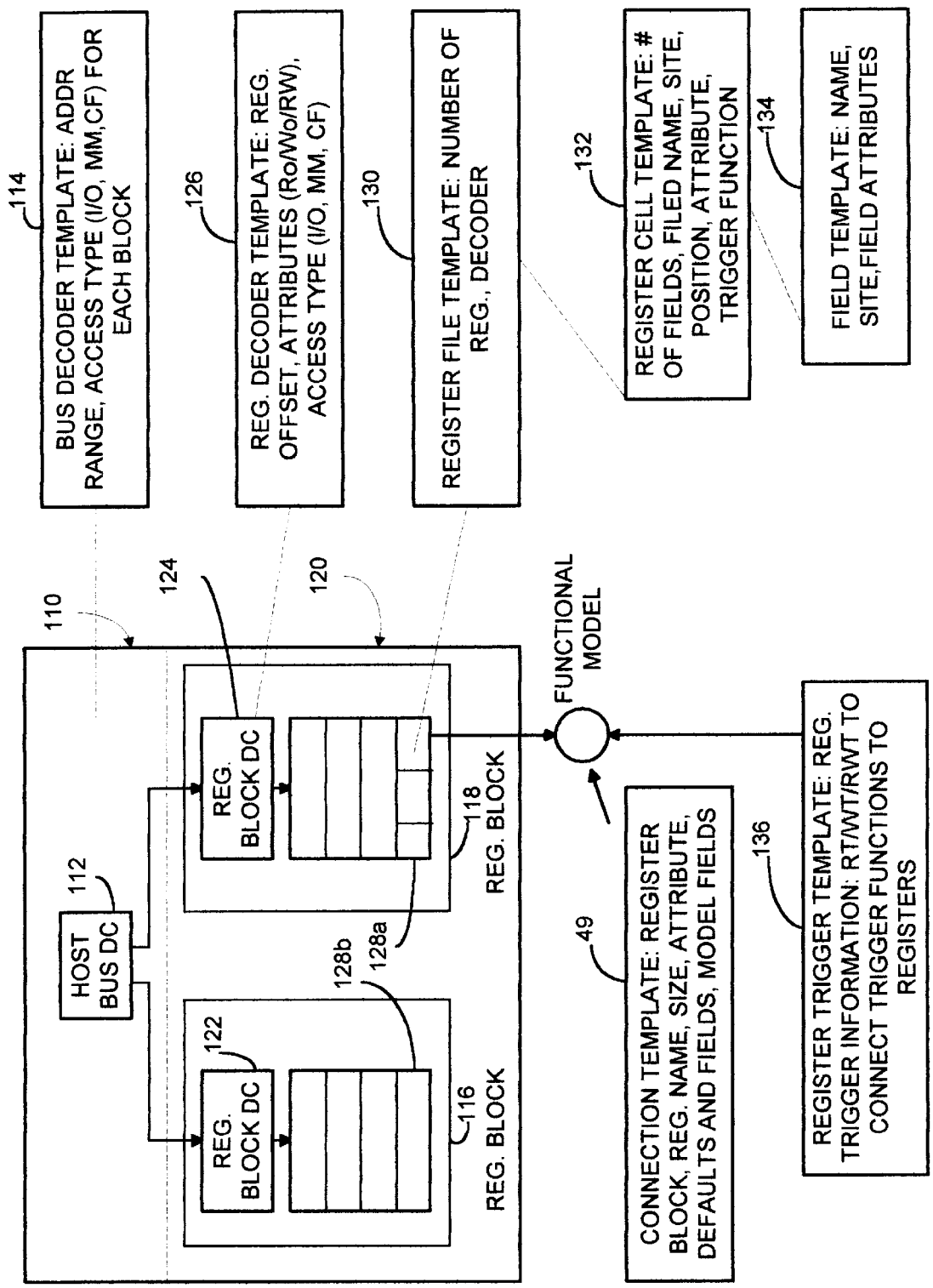
FIG. 7 is a block diagram depicting an example of associated register templates used for automatically modeling registers for integrated circuit design in accordance with the invention.

FIG. 7 diagrammatically shows an example of a portion of an integrated circuit to be modeled based on the behavioral model code templates 60. A similar set of hardware design simulation templates would also be created and used for generation of the hardware design simulation code. A section of an integrated circuit serving as the interface to the host bus is generally indicated by arrow 110. This section includes a host bus decoder 112. As such, the system 70 stores a register bus decoder template 114 for use in generating the API layer 42. The bus decoder template 114 includes the register address range and access type for each register block 116 and 118. For example, the access type may be an input/output access type, memory mapped access type, or configuration access type. Therefore, the address range field and access type field are to be filled in by register data set forth in the common register specification source file 34.

The register layer generally indicated by arrow 120 is characterized by a number of associated templates. For example, since each register block 116 and 118 has its own register block decoder 122 and 124, the code templates 60 include a register decoder template 126 for each of the decoders 122 and 124. The register decoder template 126 includes data indicating the register offset, the attributes such as whether the register is a read-only, write-only or read/write register, and the access type of the decoder such as whether the decoder is an input/output, memory mapped or configuration access type.

Since each register block 116 and 118 also has a number of registers generally indicated as 128a and 128b, the behavioral model register code templates 60 include a register file template 130 having data indicating the number of registers and the decoder associated with those registers. The register file template 130 is associated to a register cell template 132 containing the number of fields, and the fields such as the name, site, position, attribute and trigger function of the register. Register cell template 132 is associated with field template 134 which includes the name, site and field attributes for each field. The connection template 49 includes the fields indicating the register blocks, register names, size, attributes, defaults, fields and the model fields to facilitate the creation and use of the register layer to interface with the model layer. The model fields are used by the functional model internally for storing information relevant to the functional operation of the functional model that may be mapped to a register field (if the model field is to be accessed by the host).

The behavioral model register code template 60 also includes register trigger template 136 which indicates the register trigger information for each register indicating whether the register operates on a read trigger, a write trigger, or a read/write trigger. The register trigger template connects the trigger functions to the registers. These templates are populated with requisite data form the .REG file to generate the behavioral model register code 40 and the hardware design simulation code 38 as previously described.

Thus, the disclosed system and method provides a mechanism for mapping internal model fields into arbitrary register positions without requiring any parts of the software behavioral model to change whenever a change to the register layout occurs. As a result, the register layer can be thought of as an entity to itself, independent of the layer that lies below it. This provides more freedom and flexibility during the programming model phase of the design for experimentation in register layout. Accordingly, the connections between the changing register layout and the model are maintained automatically and the reshuffling of registers and their fields does not require modification to the model itself. The result is the creation of a system that can process the single register specification source file to automatically generate the necessary register layer code, and maintain the field connections to the model.

The system works in two modes in order to satisfy the design development cycle. The system creates initial behavioral model register code (register layer) from the register file where none existed before, and the system merges new code changes into an existing model during the iteration phases of the design. It is this merging ability which provides an important advantage in keeping pace with the iterative nature of the design. By automating the changes (additions, deletions, and deltas) in the register layer of the design, the model automatically reproduces register changes and remains consistent with the design. Therefore, it will be recognized that by enabling the merge capability at the VHDL level as well as providing simultaneous generation of the behavior model code and the hardware design simulation code from a single specification file, the disclosed system better insures that both outputs are consistent. As a result, little effort is necessary for maintaining both the behavioral model register code and hardware design simulation code (VHDL code) with respect to register specification changes. The primary effort remaining becomes the updating and maintaining of the register specification source text file which is simply a matter of editing text.

Those having ordinary skill in the art will recognize that different hardware description languages (HDL) for the hardware simulation code, and different target languages for the behavioral model code, such as Pascal, Fortran, or Java may be used. Also, other attribute descriptions for registers or register fields can be used. In addition, the register specification source data file can be expanded to include more details about the device itself, such as register space information, memory requirements, and operating modes.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A method for automatically modeling registers for use in integrated circuit design comprising:
   storing integrated circuit (IC) register description source data representing organized register data;
   automatically generating hardware design simulation code from the register description source data for use in design simulation of the IC;
   automatically generating behavioral model register code, representing behavioral characteristics of the IC, from the same register description source data for use in finalizing the IC design.

2. The method of claim 1 wherein the register description source data is a text file.

3. The method of claim 1 further including the step of:
   automatically generating register test code for the hardware design simulation code and the behavioral model register code from the register description source data for the purpose of testing the hardware design simulation code and the behavioral model register code.

4. The method of claim 1 wherein the step of automatically generating hardware design simulation code includes storing predefined register templates in a same language as the hardware design simulation code, associating the register description source data to the register templates and automatically populating the associated register templates with appropriate register description source data to automatically create a hardware design simulation register layer.

5. The method of claim 1 wherein the step of automatically generating behavioral model register code includes storing predefined register templates in a same language as the behavioral model register code, associating the register description source data to the register templates and automatically populating the associated register templates with appropriate register description source data to automatically create a behavioral model register layer.

6. The method of claim 1 further including automatically generating documentation from the register description source data source representing configuration information of the register as represented by the description data.

7. The method of claim 1 including the step of generating software headers from the register description source data using a software header template.

8. The method of claim 1 wherein the step of automatically generating behavioral model register code includes forming a register layer based on the IC register description source data and generating a connection file based on the IC register description source data so that the connection file facilitates mapping the register layer to a functional model layer defining the functions for registers in the register layer.

9. The method of claim 8 further including the step of merging register layer data from a current register layer with new register description source data to preserve a previous state of the code and adding only new register data.

10. The method of claim 9 wherein the step of merging further includes:
    analyzing updated register description source data;
    analyzing existing behavioral model code or existing hardware design simulation code, to obtain data that was in previous register description source data and to determine current register layer connections to the functional model layer;
    comparing the updated register description source data to the obtained data and determined current connections; and
    generating new model code based on the comparison of the updated register description source data and the obtained data and determined current connections.

11. The method of claim 9 wherein the step of comparing includes comparing data in a current connection file and the updated register description source data and generating a report identifying detected differences.

12. The method of claim 2 wherein the text file contains description data representing register header data and register body data and the register header data includes at least one of the following types of register data: register name, offset data to a base address of registers in a register class, number of bits in a register, a register type, whether the register is a read, write or read/write type, and whether a register is an indirect register.

13. The method of claim 12 wherein the register body data includes at least one of the following types of field data: field name, field position, field size, field type, and field attributes.

14. A method for automatically modeling registers for use in integrated circuit design comprising:
    storing a single register specification data source representing grouped register data;
    automatically generating a behavioral register for the integrated circuit from the single register specification data source and automatically generating a hardware design simulation model from the single register specification data sources wherein an application interface layer and a register model layer is created in a behavioral model register code, and in a different hardware design simulation code, from the same single register specification data source; and
    merging register layer data from a current register layer with new register description source data to generate new model code.

15. The method of claim 14 further including the step of automatically generating register test code for the hardware design simulation code and the behavioral model register code from the register description source data.

16. The method of claim 15 further including the step of automatically generating register test code includes the steps of storing register test code templates and generating the register test code using the templates and the register description source data.

17. The method of claim 14 wherein the step of automatically generating a behavioral register model and automatically generating a hardware design simulation model from the same single register specification data source includes the steps of:

storing a first set of predefined register templates containing predefined code in a first programming language for use in generating the behavioral model register code, associating the register description source data to the first set of register templates and automatically populating the associated first set of register templates with appropriate register description source data to automatically create a behavioral model register layer; and storing a second set of predefined register templates in a second programming language for use in generating the hardware design simulation code, associating the register description source data to the second set of register templates and automatically populating the associated second set of register templates with appropriate register description source data to automatically create a hardware design register layer.

18. The method of claim 17 wherein the first and second set of register templates each include at least a bus decoder template for creating the application interface layer, and a register decoder template operatively associated to a register file template and a connection template to facilitate creation and use of the register layer to interface with a model layer.

19. The method of claim 18 wherein each register file template is operatively associated to a register cell template and the register cell template is operatively associated to a field template.

20. The method of claim 18 wherein the step of merging includes merging register layer data from another previously generated register layer by preserving a previous state of the code and adding only new register data.

21. The method of claim 20 wherein the step of merging further includes:

analyzing updated register description source data;

analyzing existing behavioral model code or existing hardware design simulation code, to obtain data that was in previous register description source data and to determine current register layer connections to the functional model layer;

comparing the updated register description source data to the obtained data and determined current connections; and generating new model code based on the comparison of the updated register description source data and the obtained data and determined current connections and preserving a previous state of the model code by adding only new register data.

22. A system for automatically modeling registers for use in integrated circuit design comprising:

memory means for storing integrated circuit register description source data representing organized register data and for storing predefined register templates; and processing means for automatically generating hardware design simulation code from the register description source data and automatically generating behavioral model register code from the same register description source data using the predefined register templates for use in finalizing the IC design.

23. The system of claim 22 wherein the processing means also preserves a previous state of code by deleting only obsolete model code.

24. The system of claim 23 wherein the processing means further includes means for automatically generating register test code for the hardware design simulation code and the behavioral model register code from the register description source data and predefined test templates.

* * * * *